United States Patent
Aoki et al.

(10) Patent No.: US 7,700,156 B2
(45) Date of Patent: Apr. 20, 2010

(54) METHOD AND APPARATUS FOR FORMING SILICON OXIDE FILM

(75) Inventors: Kimiya Aoki, Tokyo (JP); Katsushi Suzuki, Tokyo (JP); Asami Shirakawa, Tokyo (JP); Kenji Tago, Tokyo (JP); Keisuke Suzuki, Tokyo (JP); Kazuo Saki, Yokohama (JP); Shinji Mori, Yokohama (JP)

(73) Assignees: Tokyo Electron Limited, Tokyo (JP); Kabushiki Kaisha Toshiba, Tokyo (JP)

( * ) Notice: Subject to any disclaimer, the term of this patent is extended or adjusted under 35 U.S.C. 154(b) by 1495 days.

(21) Appl. No.: 10/879,034

(22) Filed: Jun. 30, 2004

(65) Prior Publication Data

US 2005/0056220 A1   Mar. 17, 2005

(30) Foreign Application Priority Data

Jul. 4, 2003   (JP)   ............................. 2003-192063
Jun. 16, 2004   (JP)   ............................. 2004-178669

(51) Int. Cl.
  C23C 16/00   (2006.01)
  C23C 14/10   (2006.01)
  C23C 16/40   (2006.01)
(52) U.S. Cl. .............................. 427/248.1; 427/255.23; 427/255.27; 427/255.28; 427/255.37
(58) Field of Classification Search .................. 438/773
  See application file for complete search history.

(56) References Cited

U.S. PATENT DOCUMENTS 5,458,685 A * 10/1995 Hasebe et al. ............... 118/724
5,935,650 A * 8/1999 Lerch et al. ............... 427/255.4
6,037,273 A * 3/2000 Gronet et al. ............... 438/773
6,368,984 B1 * 4/2002 Tomita et al. ............... 438/773
6,638,877 B2 * 10/2003 Rotondaro .................. 438/770

FOREIGN PATENT DOCUMENTS

| JP | 11-67747 | 3/1999 |
| JP | 11-87329 | 3/1999 |
| JP | 11-162977 | 6/1999 |
| JP | 11-186255 | 7/1999 |
| JP | 11-204511 | 7/1999 |
| JP | 11-330468 | 11/1999 |
| WO | WO98/39802 | 9/1998 |

* cited by examiner

*Primary Examiner*—Michael Cleveland
*Assistant Examiner*—Michael G Miller
(74) *Attorney, Agent, or Firm*—Oblon, Spivak, McClelland, Maier & Neustadt, L.L.P.

(57) ABSTRACT

In a method of forming a silicon oxide film, a target substrate that has a silicon layer on a surface is loaded into a process area within a reaction container, while setting the process area to have a loading temperature of 400° C. or less. Then, the process area that accommodates the target substrate is heated, from the loading temperature to a process temperature of 650° C. or more. Water vapor is supplied into the reaction container during said heating the process area, while setting the water vapor to have a first concentration in an atmosphere of the process area, and setting the process area to have a first reduced pressure. After said heating the process area to the process temperature, an oxidation gas is supplied into the reaction container, thereby oxidizing the silicon layer to form a silicon oxide film.

14 Claims, 5 Drawing Sheets

METHOD AND APPARATUS FOR FORMING SILICON OXIDE FILM

CROSS-REFERENCE TO RELATED APPLICATIONS

This application is based upon and claims the benefit of priority from prior Japanese Patent Applications No. 2003-192063, filed Jul. 4, 2003; and No. 2004-178669, filed Jun. 16, 2004, the entire contents of both of which are incorporated herein by reference.

BACKGROUND OF THE INVENTION

1. Field of the Invention

The present invention relates to a method and apparatus for processing a target substrate having a silicon layer on the surface, such as a silicon wafer, to oxidize the silicon layer and form a silicon oxide film.

2. Description of the Related Art

Films of various kinds used in semiconductor devices need to be made thinner, owing to the demands of multi-layered and thinner arrangement of semiconductor devices used as components in semiconductor integrated circuits. For example, as regards the gate insulating film of MOSFETs, a method has been studied of first forming a silicon oxide film having a very small thickness of about 1 nm, and then irradiating the silicon oxide film with, e.g., nitrogen plasma for nitridation to form an insulating film. In order to form such very thin silicon oxide films with high planar uniformity, high inter-surface uniformity (among target substrates), and high reproducibility, the oxidation process should be performed at a very low oxidation rate (film-formation rate).

On the other hand, as the process temperature is lowered to reduce the oxidation rate, the film quality tends to be more deteriorated. Accordingly, it is preferable that the process temperature is not lowered so much, but is set to be, e.g., 650° C. or more. As an oxidation method, there is dry oxidation, which employs oxygen gas, and wet oxidation, which employs water vapor. An oxide film formed by wet oxidation is higher in film quality than an oxide film formed by dry oxidation. However, where a reaction tube is supplied with water vapor generated by a combustion method of burning hydrogen and oxygen, it is difficult to form very thin oxide films with good controllability, and thus is difficult to form oxide films with high uniformity and high reproducibility. This is so, because, in this case, an oxide film is formed at a high film-formation rate due to a high ratio of water vapor relative to a mixture gas of water vapor and oxygen.

Jpn. Pat. Appln. KOKAI Publication No. 11-204511 (see FIG. 1, and paragraph numbers [0020] and [0022]) discloses an oxidation apparatus including a water vapor generator, which generates a small amount of water vapor by causing hydrogen and oxygen to react with each other in the presence of a catalyst. FIG. 8 is a side view showing a conventional vertical heat-processing apparatus of this type.

As shown in FIG. 8, this apparatus includes a vertical reaction tube (reaction container or process chamber) 11, and a load-lock chamber 12 defining a loading area therebelow. A water vapor generator 14 is connected to the reaction tube 11. The generator 14 generates water vapor by causing hydrogen and oxygen to react with each other in the presence of a catalyst, such as platinum or nickel. A wafer boat 13 is employed to hold a number of semiconductor wafers W, in a state where they are stacked at intervals. When a process is performed, the reaction tube 11 and loadlock chamber 12 are vacuum-exhausted to a predetermined vacuum level. Then, the wafer boat 13 is loaded into the reaction tube 11. Then, water vapor is supplied into the reaction tube 11 to form a silicon oxide film on the wafers W.

International Publication No. WO 98-39802 (see page 43, lines 4 to 24, claim 8, and FIGS. 9, 11, and 13) discloses a so-called process apparatus of the cluster tool type, which includes an airtight transfer chamber and a plurality of single-wafer process chambers connected thereto. This apparatus also includes a water vapor generator, which generates water vapor by causing hydrogen gas and oxygen gas to react with each other in the presence of a catalyst. When a process is performed, a susceptor disposed in a process chamber is first heated by a heater. At this time, it is set such that a wafer is to be heated to a process temperature of 800 to 900° C. when the wafer is placed on the susceptor. Then, the process chamber is purged by nitrogen gas, and a wafer is loaded into the process chamber. Then, moisture and non-reacted oxygen gas are supplied from the water vapor generator into the closed process chamber, to oxidize the wafer surface and form a gate insulating film having a thickness of 5 nm or less.

Jpn. Pat. Appln. KOKAI Publication No. 11-186255 (see FIG. 3, and paragraph numbers [0038] and [0059]) discloses another method of forming a silicon oxide film. According to this method, a first film-formation step is performed at a lower temperature to form a silicon oxide film on the surface of a silicon layer, wherein the silicon oxide film functions as a protection film as well. Then, a second film-formation step is performed at a higher temperature to reduce the surface roughness of the silicon layer. In this case, a heating step is performed in an inactive gas atmosphere, pressure-reduced atmosphere, or oxidation atmosphere containing a wet gas.

BRIEF SUMMARY OF THE INVENTION

An object of the present invention is to provide a method and apparatus for forming a silicon oxide film with very small thickness and high quality.

According to a first aspect of the present invention, there is provided a method of forming a silicon oxide film, comprising:

loading a target substrate that has a silicon layer on a surface into a process area within a reaction container, while setting the process area to have a loading temperature of 400° C. or less;

heating the process area that accommodates the target substrate, from the loading temperature to a process temperature of 650° C. or more;

supplying water vapor into the reaction container during said heating the process area, while setting the water vapor to have a first concentration in an atmosphere of the process area, and setting the process area to have a first reduced pressure; and supplying an oxidation gas into the reaction container, after said heating the process area to the process temperature, thereby oxidizing the silicon layer to form a silicon oxide film.

According to a second aspect of the present invention, there is provided an apparatus for forming a silicon oxide film by oxidizing a silicon layer on a surface of a target substrate, the apparatus comprising:

a reaction container having a process area configured to accommodate the target substrate;

a heater configured to heat the process area;

an exhaust system configured to exhaust the reaction container;

a supply system configured to supply a process gas into the reaction container, and including a portion to supply water vapor into the reaction container; and a controller configured to control an operation of the apparatus, and to execute setting the process area to have a loading temperature of 400° C. or less, when the target substrate is loaded into the process area, heating the process area that accommodates the target substrate, from the loading temperature to a process temperature of 650° C. or more;

supplying water vapor into the reaction container during said heating the process area, while setting the water vapor to have a first concentration in an atmosphere of the process area, and setting the process area to have a first reduced pressure; and supplying an oxidation gas into the reaction container, after said heating the process area to the process temperature, thereby oxidizing the silicon layer to form a silicon oxide film.

The method according to the first aspect and the apparatus according to the second aspect may be arranged as follows: Specifically, the silicon oxide film has a film thickness of 1.6 nm or less. The supplying water vapor into the reaction container is continuously performed from a time when the process area has a temperature of less than 400° C. to a time when the process area has the process temperature. In other words, said supplying water vapor into the reaction container starts before a temperature of the process area goes beyond 400° C.

The method according to the first aspect and the apparatus according to the second aspect may be arranged as follows: Specifically, they further comprises generating the water vapor by causing hydrogen gas and oxygen gas to react with each other outside the reaction container. In this case, said generating the water vapor comprises causing the oxygen gas and the hydrogen gas to react with each other in presence of a catalyst, while setting the oxygen gas to be an amount larger than that determined by a stoicheiometric ratio in a water generating reaction, so as to supply surplus oxygen gas along with the water vapor into the reaction container. The first concentration is adjusted by controlling a flow rate of any one of the hydrogen gas, the oxygen gas, and a diluting gas to be mixed therewith, or the first reduced pressure.

The method according to the first aspect and the apparatus according to the second aspect may be arranged as follows: Specifically, the first concentration falls in a range of 5 ppm to 1000 ppm. The first reduced pressure falls in a range of 66.5 Pa to $13.3 \times 10^3$ Pa=13.3 kP (0.5 Torr to 100 Torr).

The method according to the first aspect and the apparatus according to the second aspect may be arranged as follows: Specifically, the oxidation gas consists essentially of water vapor. In this case, the water vapor used as the oxidation gas is set to have a concentration in an atmosphere of the process area, higher than the first concentration.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
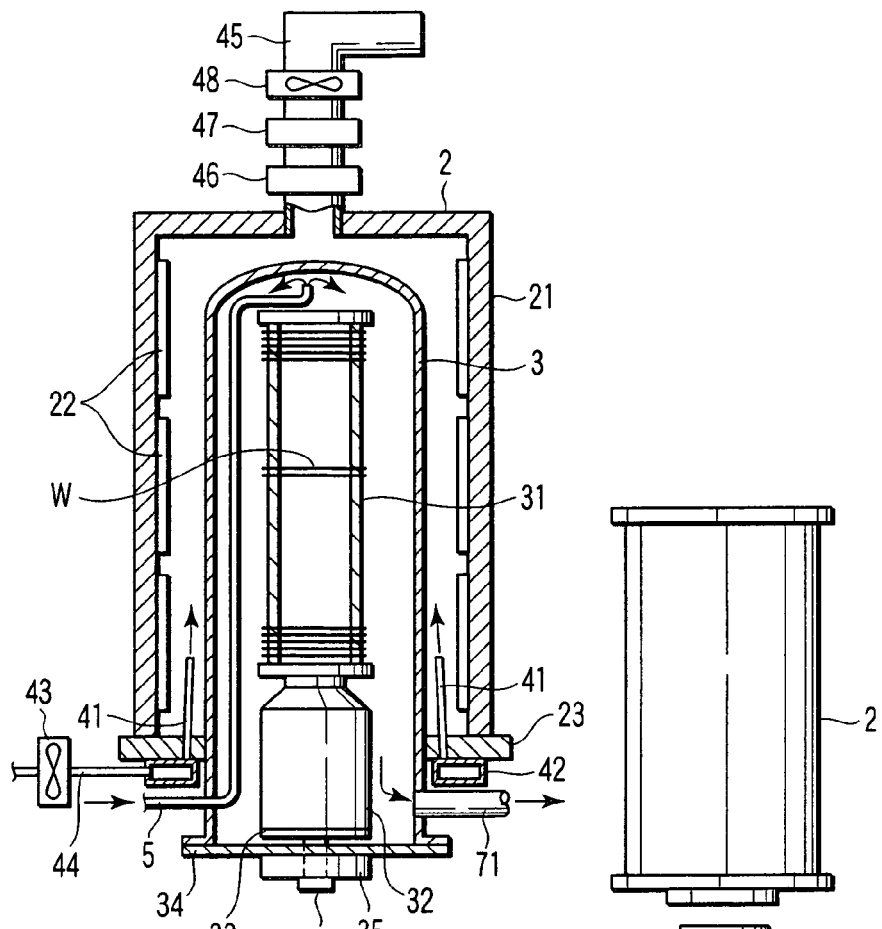
FIG. 1 is a sectional side view showing a vertical heat-processing apparatus according to a first embodiment of the present invention.

In the process of developing the present invention, the inventors studied problems of conventional techniques in relation to a method of forming a silicon oxide film by thermal oxidation. As a result, the inventors have arrived at the findings given below.

According to the technique disposed in Jpn. Pat. Appln. KOKAI Publication No. 11-204511, since the loading area is set to have a vacuum atmosphere, the reaction tube 11 is prevented from including atmospheric air therein when the wafer boat 13 is loaded. In this case, even if the interior of the reaction tube 11 is set to have an atmosphere with a higher temperature, such as a process temperature, wafers W are not oxidized by atmospheric air. If they are oxidized by atmospheric air, an oxide film low in film quality is formed. This technique, however, requires a vacuum process chamber defining a large space to accommodate the wafer boat 13, and a vacuum-exhaust system, resulting in the size of the apparatus being increased.

According to the technique disposed in International Publication No. WO 98-39802, since the transfer chamber and single-wafer process chambers connected thereto are set to have a nitrogen atmosphere throughout, the process chambers are prevented from including atmospheric air therein. However, if a structure of the cluster tool type is applied to a vertical heat-processing apparatus, which subjects a number of wafers as a batch (all together) to an oxidation process, the size of the apparatus must be increased. For this reason, in general, vertical heat-processing apparatuses are arranged such that a wafer boat is loaded into a reaction container from an atmospheric air atmosphere. In this case, when the wafer boat with wafers held thereon is loaded while the interior of the reaction container is heated to a process temperature, the reaction container includes atmospheric air therein. As a result, the atmospheric air causes initial oxidation of the surface of the wafers, thereby forming an initial oxide film low in film quality.

According to the technique disposed in Jpn. Pat. Appln. KOKAI Publication No. 11-186255, this technique is unfavorably applied to a process for forming a very thin oxide film. Specifically, since the two film-formation step are performed at very different temperatures, the ratio in thickness of an oxide film formed by the first film-formation step is too large, which hinders the film quality being uniform. Furthermore, since the first film-formation step is performed in wet gas atmosphere (which is construed as being performed in an atmospheric pressure atmosphere), an oxide film is formed during the heating step. Accordingly, this technique is not suitable as a method of forming a very thin gate insulating film.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 2:
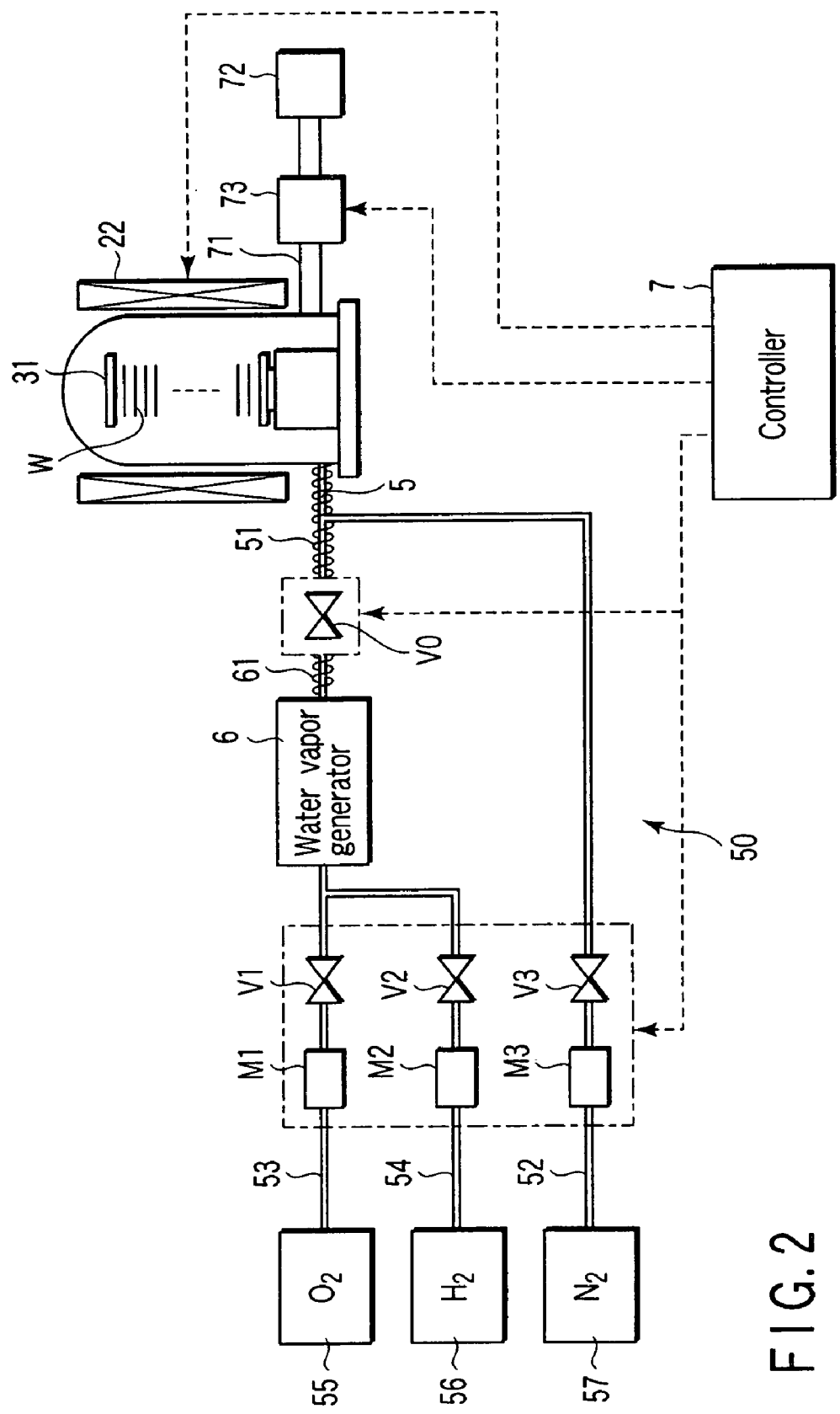
FIG. 2 is a schematic diagram showing an arrangement including the gas supply system and control system of the apparatus shown in FIG. 1.

FIG. 1 is a sectional side view showing a vertical heat-processing apparatus according to a first embodiment of the present invention. FIG. 2 is a schematic diagram showing an arrangement including the gas supply system and control system of the apparatus shown in FIG. 1.

As shown in FIG. 1, this apparatus includes a vertical heating furnace 2 fixed to a base body 23 at the bottom. The heating furnace 2 is formed of, e.g., a cylindrical insulating body 21, which is provided with a ceiling and heating means disposed inside. For example, the heating means is formed of heaters 22 of the resistance heating type, which are disposed circumferentially along the inner wall-surface of the insulating body 21. The process area (heat-processing atmosphere area) is divided into a plurality of zones in the vertical direction, and the heaters 22 are respectively disposed at the zones, so that the zones can be controlled in heating independently of each other.

A reaction tube (reaction container or process chamber) 3 made of, e.g., quartz is disposed inside the heating furnace 2. The reaction tube 3 has a vertical structure of with a closed top, in which the process area is defined. The reaction tube 3 is fixed to the base body 23. A plurality of nozzles 41 are disposed along a circle on the base body 23, to supply a cooling gas, such as air, into the gap between the heating furnace 2 and reaction tube 3. The nozzles 41 are connected to a gas supply head 42 having a ring shape and attached to the base body 23. The gas supply head 42 is supplied with air from a gas supply pipe 44 provided with a fan 43 disposed thereon.

An exhaust duct 45 is connected to the ceiling of the heating furnace 2, to exhaust cooling air. The exhaust duct 45 is provided with a switching shutter 46, a cooling mechanism 47 for cooling exhaust air, and an exhaust fan 48, provided in this order. Since cooling air can be thus supplied into the heating furnace 2, the reaction tube 3 can be forcibly cooled by air at a high rate after heat processing.

The apparatus shown in FIG. 1 also includes a wafer boat 31 or holder to hold a plurality of target substrates, such as semiconductor wafers W, in a state where they are stacked at intervals. The wafer boat 31 is placed on a lid 34 through a heat insulator or insulating cylinder 32 and a turntable 33. The lid 34 is attached to a boat elevator 35, and is used to open and close a port at the bottom of the reaction tube 3. The boat elevator 35 is provided with a rotation mechanism 36 to rotate the turntable 33 along with the wafer boat 31. The boat elevator 35 is moved up and down, so that the wafer boat 3 is loaded and unloaded into and from the reaction tube 3.

A gas supply pipe 5 extending from a gas supply system 50 is inserted into the bottom of the reaction tube 3 from the outside. For example, the gas supply pipe 5 vertically extends upward in the reaction tube 3 and is bent at the distal end to spout a process gas toward the ceiling of the reaction tube 3 near the center thereof. On the other hand, as shown in FIG. 2, the upstream side of the gas supply pipe 5 is bifurcated into a first gas supply pipe 51 and a second gas supply pipe 52.

The first gas supply pipe 51 is provided with a water vapor generator 6 used as water vapor generating means. The first gas supply pipe 51 is further divided into an oxygen ($O_2$) gas supply pipe 53 and a hydrogen ($H_2$) gas supply pipe 54 at an upstream position from the water vapor generator 6. The proximal side of the oxygen gas supply pipe 53 is connected to an oxygen gas supply source 55 through a valve V1 and a mass-flow controller M1. The proximal side of the hydrogen gas supply pipe 54 is connected to a hydrogen gas supply source 56 through a valve V2 and a mass-flow controller M2. The proximal side of the second gas supply pipe 52 is connected to a nitrogen gas supply source 57 used as a diluting gas (inactive gas) supply source, through a valve V3 and a mass-flow controller M3. The mass-flow controllers M1 to M3 are used as flow rate adjusting means for adjusting gas supply flow rates.

The first gas supply pipe 51 is provided with a valve V0 at a downstream position from the water vapor generator 6. The downstream portions of the gas supply pipes 5 and 51 are provided with a heater or heating means, such as a wrapping tape heater 61, to heat them to prevent water vapor from condensing.

The water vapor generator 6 has heating means for heating a gas passing therethrough. A catalyst, such as platinum, is disposed in the gas passage of the water vapor generator 6. In the water vapor generator 6, oxygen gas and hydrogen gas are heated to a predetermined temperature of, e.g., 500° C. or less, and come into contact with the catalyst. As a consequence, in the presence of the catalyst, oxygen gas and hydrogen gas react with each other and generate a small amount of water vapor. In this embodiment, oxygen gas and hydrogen gas are caused to react while the amount of oxygen gas is set to be larger than that determined by the stoicheiometric ratio. As a consequence, water vapor and non-reacted oxygen gas flow out from the water vapor generator 6. Such a water vapor generator 6 makes it possible to set the concentration of water vapor to be as low as 5 ppm to 1000 ppm in the mixture of water vapor, oxygen gas, and diluting gas (nitrogen gas in this embodiment) within the pressure-reduced reaction tube 3.

An exhaust pipe 71 having an inner diameter of, e.g., 3 inches is connected to the bottom of the reaction tube 3. The proximal side of the exhaust pipe 71 is connected to a vacuum pump 72 used as pressure-reducing means. The exhaust pipe 71 is provided with pressure adjusting means 73. In this embodiment, the pressure adjusting means 73 includes a main valve for opening and closing the exhaust pipe 71, as well as a device for adjusting pressure, such as a butterfly valve.

As shown in FIG. 2, this apparatus includes a controller (controlling means) 7, such as a computer. The controller 7 has functions for controlling the heater 22, gas supply system 50, pressure adjusting means 73, and so forth. The valves V0 to V3 and mass-flow controllers M1 to M3 of the gas supply system 50 are operated to control the supply, stop, and flow rate of the gases. In order to control components of the gas supply system 50, the controller 7 transmits control signals to the respective controllers (not shown) of the components. The controller 7 stores a recipe that contains process parameters and process sequences, and a program to read the recipe. In accordance with the program, the flow rates of oxygen gas and hydrogen gas, heater 22, and pressure adjusting means 73 are controlled in the heating step after wafers W are loaded into the reaction tube 3, as described later.

Figure 3:
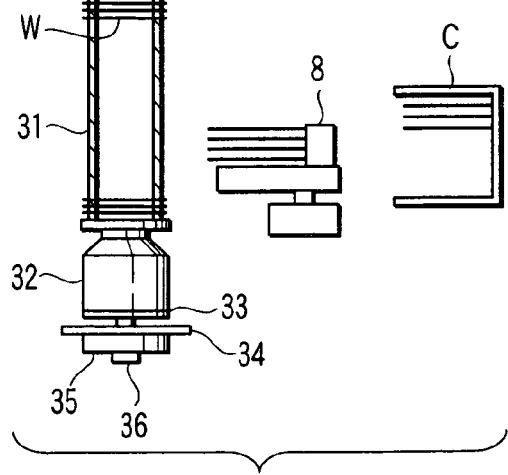
FIG. 3 is a side view showing a manner of transferring wafers in the apparatus shown in FIG. 1.
Figure 4:
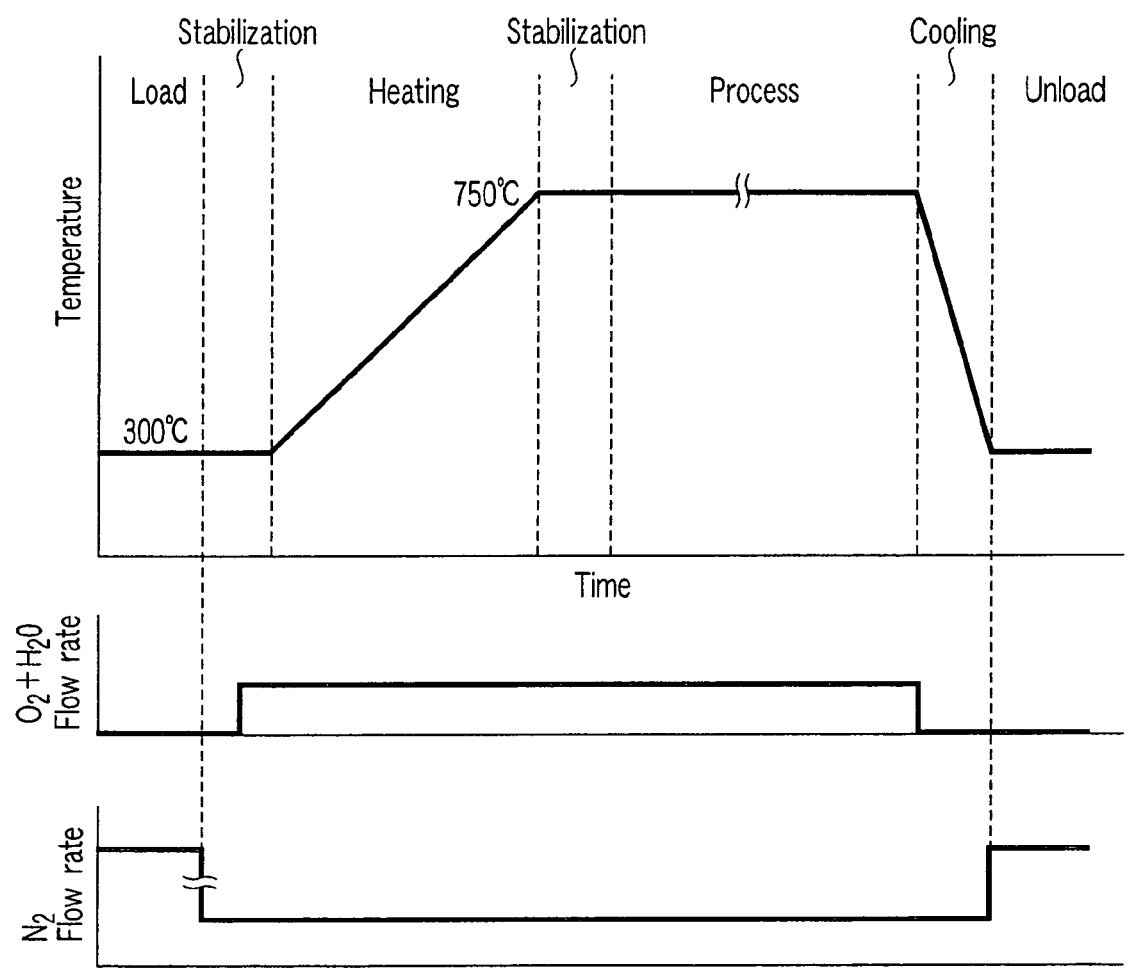
FIG. 4 is a diagram showing the temperature and gas supply conditions of respective steps in the apparatus shown in FIG. 1.

Next, with reference to FIGS. 3 and 4, an explanation will be given of a heat-processing method performed in the apparatus shown in FIG. 1. FIG. 3 is a side view showing a manner of transferring wafers in the apparatus shown in FIG. 1. FIG. 4 is a diagram showing the temperature and gas supply conditions of respective steps in the apparatus shown in FIG. 1. In FIG. 4, executed steps, set temperatures in the reaction tube 3 (process area), and atmospheres in the reaction tube 3 are shown in time sequence (i.e., the horizontal axis denotes time).

First, the valve V3 is opened to purge the interior of the reaction tube 3 by nitrogen gas, while the temperature in the reaction tube 3 is set at, e.g., 300° C. At this time, the valves V1 and V2 are also opened, to cause oxygen gas and hydrogen gas to react with each other in the presence of the catalyst within the water vapor generator 6 to generate a small amount of moisture. In this reaction, for example, it is set such that the ratio of moisture (the volume percent of water vapor) relative to a mixture gas of water vapor (moisture) and oxygen gas falls in a range of 0.1 to 80%. In order to achieve this, for example, the flow rates of oxygen gas and hydrogen gas are set to be 350 sccm and 50 sccm, respectively. In addition, for example, the flow rate of nitrogen gas used as a diluting gas to be mixed with oxygen gas and hydrogen gas is set to be 10 slm.

With this state, as shown in FIG. 3, wafers W are transferred from a wafer storing container or wafer carrier C onto the wafer boat 31 by a wafer transfer device (target substrate transfer means) 8. At this time, the wafers W are transferred one by one, or one set by one set each formed of a plurality, e.g., 5 wafers, in descending order from the upper side of the wafer boat 31. Each wafer W has a silicon layer on the surface, and has been cleaned by hydrofluoric acid in a previous step.

After the transfer of the wafers W is completed, the wafer boat 31 is moved up and loaded into the reaction tube 3. The port at the bottom of the reaction tube 3 is closed by the lid 34. Then, this state is maintained as a standby state for a predetermined time until the temperature inside the reaction tube 3 becomes stable. During this standby period, the reaction tube 3 is vacuum-exhausted (pressure-reduced exhaust), and is then filled with nitrogen gas. Such a cycle of alternately performing a vacuum exhaust step and a nitrogen gas filling step is repeated, e.g., two or three times (cyclic purge). Then, the pressure inside the reaction tube 3 is set at, e.g., 133 Pa (1 Torr).

Then, while the flow rates of oxygen gas and hydrogen gas are maintained, the valve V0 is opened to supply a process gas through the water vapor generator 6 into the heat-processing apparatus. The moisture concentration in the process area with a pressure-reduced atmosphere is set at, e.g., 6.3 ppm. The flow rate of nitrogen gas at this time is set at 10 slm.

After the temperature becomes stable, while the pressure and gas supply state are maintained, the heater 22 is controlled to perform a heating step. For example, the interior of the reaction tube 3 is heated to a heat-processing temperature of, e.g., 650° C. or more, such as 750° C., at an average heating rate of 50° C./minute to 100° C./minute. Then, this state is maintained as a standby state for, e.g., thirteen minutes until the temperature becomes stable.

Then, a thermal oxidation process is started. Specifically, the flow rates of oxygen gas and hydrogen gas are increased in some degree to 400 sccm and 100 sccm, respectively. With this operation, the ratios of moisture and oxygen gas in the atmosphere of the process area within the reaction tube 3 are increased, and the pressure is set at 150 Pa. In this thermal oxidation process, the silicon layer on the surface of each wafer W is oxidized by moisture, and a silicon oxide film is grown at a very slow film-formation rate of, e.g., 0.25 Å/minute (0.025 nm/minute). For example, the process time is set at 40 minutes to form a silicon oxide film with an aimed thickness of 10 Å (1.0 nm).

Then, the cooling nozzles 41 shown in FIG. 1 are used to supply air and forcibly cool the interior of the reaction tube 3 down to 300° C. While the interior of the reaction tube 3 is cooled, the reaction tube 3 is purged by nitrogen gas and returned to atmospheric pressure. Then, the wafer boat 31 is moved down and unloaded from the reaction tube 3. Then, with a transfer operation reverse to that described with reference to FIG. 3, the wafers W are taken out by the transfer device 8, in ascending order from the lower side of the wafer boat 31. These sequential steps described above are performed in accordance with a program and recipe in the controller 7.

According to this embodiment, the following effects are obtained. First, since the wafers are transferred in (loaded) while the temperature inside the reaction tube 3 is set at a low value of 300° C., the surface of the wafers W are substantially prevented from being oxidized by atmospheric air, even if the reaction tube 3 includes atmospheric air. In other words, the loading area below the reaction tube 3 can be an atmospheric air atmosphere. In this case, the apparatus can have a compact structure, which is effectively applied to a heat-processing apparatus for performing a batch process (simultaneously processing a lot of substrates). It should be noted that, if the temperature inside the reaction tube 3 is high, a difference is caused in thermal history between a wafer W first in and a wafer W later in, which deteriorates the uniformity in film quality.

After the wafers W are loaded into the reaction tube 3, moisture is supplied while maintaining the pressure-reduced atmosphere, during the heating step up to a process temperature. Thus, the interior of the reaction tube is set to have an atmosphere with a small amount of moisture, and an initial oxide film having a high film quality is formed on each wafer W. In this respect, if an atmosphere of only nitrogen gas is used during the heating, the surface of each wafer W is caused to become rough by nitrogen.

Furthermore, if oxygen gas is supplied without moisture being supplied during the heating, an initial oxide film having a low film quality is formed. In this case, a number of free valences (dangling bonds) of silicon remain in the surface of the silicon oxide film. Although the free valences partly come from those preexistent in the silicon film, most of them come from those formed when the surface of each wafer W is cleaned by hydrofluoric acid (HF) in a previous step. Specifically, when the silicon surface is cleaned by hydrofluoric acid (HF), Si—H bonds are formed in the surface due to a reaction with the hydrofluoric acid. Then, when the wafer W is heated, Si—H bonds are broken and free valences are thereby produced.

Oxygen gas permeates into the silicon surface, and breaks bonds between silicon atoms or connects with free valences to form Si—O bonds. However, since oxygen gas has a large molecular diameter, it cannot sufficiently spread in the silicon surface. As a consequence, some free valences of silicon are left in the surface. Where a silicon oxide film to be formed is thick, free valences of silicon thus left do not affect the film quality. On the other hand, where a silicon oxide film is very thin, e.g., of 1.6 nm (16 Å) or less, the film quality of an initial oxide film influences the film quality of the entire oxide film. In the case of a gate insulating film, as free valences of silicon remain, the electrical characteristics are deteriorated, e.g., the dielectric breakdown strength becomes lower.

On the other hand, in the method according to this embodiment, the following effects are presumably obtained. Specifically, where a small amount of moisture is present in the heating step, OH groups are dissociated from $H_2O$. Since OH has a small molecular diameter, it sufficiently spreads over the silicon surface. Then, the OH forms Si—O bonds, while it breaks bonds between silicon atoms and connects with free valences of silicon. The initial oxide film thus formed can have a high quality with few free valences of silicon. As a consequence, this oxidation process can provide a very thin silicon oxide film having a high film quality.

Figure 5:
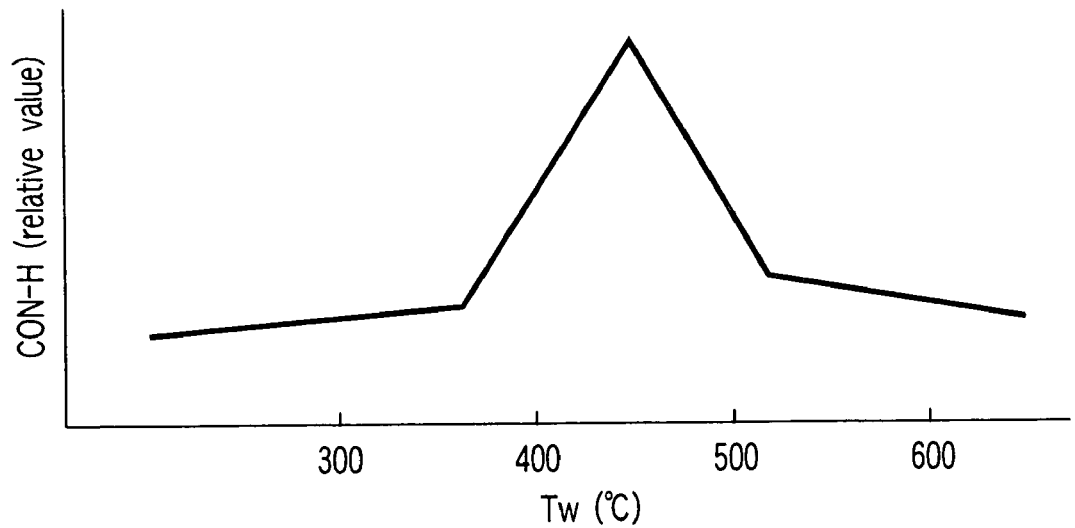
FIG. 5 is a graph showing the relationship between heating temperature Tw (° C.) of wafers cleaned by hydrofluoric acid, and hydrogen concentration CON-H (relative value) that represents the amount of generated hydrogen.

An experiment was conducted to ascertain the temperature at which Si—H bonds in the surface of a wafer W cleaned by hydrofluoric acid were broken. In this experiment, the cleaned wafer W was placed in another container and heated, so that the relationship between the heating temperature and the amount of generated hydrogen could be examined. FIG. 5 is a graph showing the relationship between the heating temperature and hydrogen concentration that represents the amount of generated hydrogen. In FIG. 5, the horizontal axis denotes heating temperature Tw (° C.), and the vertical axis denotes hydrogen concentration CON-H (relative value). As shown in FIG. 5, the amount of hydrogen hardly increased until about 360° C., but started abruptly increasing from over 360° C., and then decreased from a peak at about 450° C.

Judging from this result, it seems that free valences of silicon are produced by dissociation of hydrogen at a temperature of about 360° C. It is thus preferable that moisture has been supplied at least when the temperature of the process area reaches 360° C. However, in view of the critical temperature to obtain a certain effect, it suffices that moisture is present when the temperature of the process area reaches 400° C.

Furthermore, if the dielectric breakdown strength of a silicon oxide film needs to be improved, the moisture concentration in the atmosphere of the process area should be set at 5 ppm or more during the heating step, as shown by an example described later. On the other hand, where a completed silicon oxide film is very thin, e.g., with a film thickness of 1.6 nm or less, if the initial oxide film has a high ratio in film thickness, the film quality becomes lower. Accordingly, the growth rate of the oxide film should be as low as possible, and thus the moisture concentration is preferably set to be not so high. In light of this factor, the upper limit of the moisture concentration is preferably set to be, e.g., 1000 ppm or less, although this is not restrictive.

The moisture generator 6 employing the catalyst can generate a small amount of moisture. Accordingly, the moisture generator 6 can be effectively used to supply moisture into the process area, not only in the heating step, but also in the thermal oxidation process. As described above, during the heating step, the moisture concentration in the atmosphere of the process area is preferably controlled to be 5 ppm to 1000 ppm. In this case, in light of controllability, the flow rates of oxygen gas and hydrogen gas are preferably adjusted, such that the ratio of moisture relative to a mixture gas of water vapor and oxygen ($H_2O/(H_2O+O_2)$) is preferably set to be 0.1 to 80% in the moisture generator 6. The pressure inside the reaction tube 3 is preferably adjusted to be 66.5 Pa to 13.3 kPa (0.5 Torr to 100 Torr).

In either the heating step or thermal oxidation process, the moisture concentration in the atmosphere of the process area may be adjusted by controlling one of the flow rates of hydrogen gas, oxygen gas, and a diluting gas to be mixed therewith, or the reduced pressure inside the reaction tube 3. The value ranges of respective parameters are suitably determined, on the basis of the diameter and number of wafers to be processed, and the film quality of a silicon oxide film.

The temperature inside the reaction tube 3 in loading the wafers W is not limited to 300° C. However, as described previously, it is preferable to load the wafer W at a temperature lower than that at which the surface of a silicon layer releases hydrogen dissociated from and thus can be substantially attacked by oxygen molecules. In light of this, the temperature inside the reaction tube 3 in loading the wafers W is preferably set at 400° C. or less, and more preferably at 360° C. or less. The cleaning solution employed in cleaning the wafers W in a previous step is not limited to hydrofluoric acid, but may be another acid cleaning solution.

In the embodiment described above, the thermal oxidation process is performed by wet oxidation using water vapor for oxidation. However, the thermal oxidation process may be performed by dry oxidation using oxygen gas for oxidation, without water vapor. The process temperature should be set at 650° C. or more to form a high quality oxide film. However, the higher the temperature, the higher the oxidation rate, which makes it difficult to control formation of a thin film. Accordingly, the thermal oxidation process is preferably performed at 900° C. or less.

Second Embodiment

Figure 6:
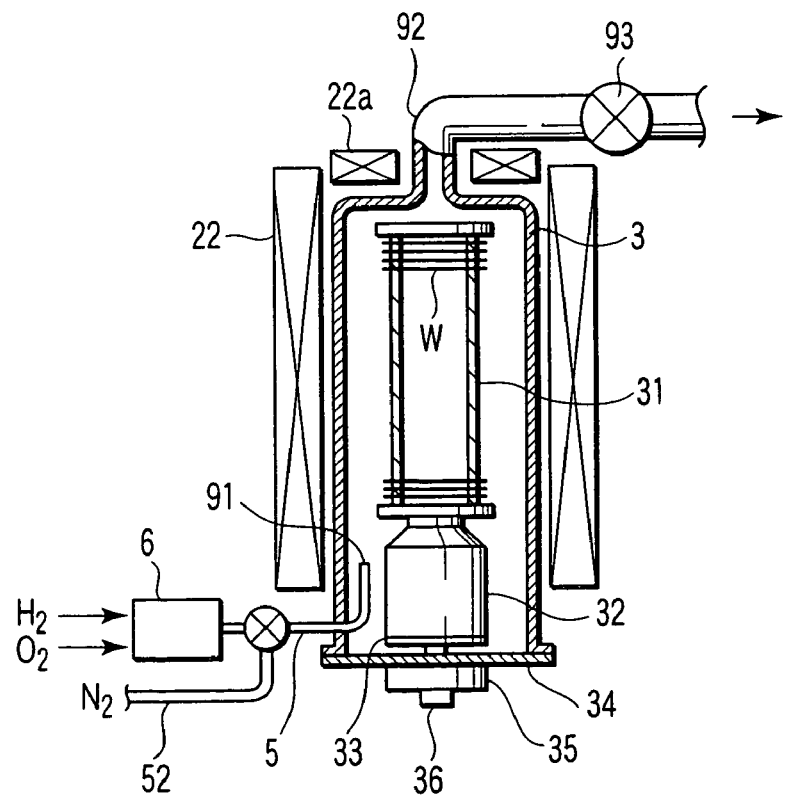
FIG. 6 is a sectional side view showing a vertical heat-processing apparatus according to a second embodiment of the present invention.

FIG. 6 is a sectional side view showing a vertical heat-processing apparatus according to a second embodiment of the present invention. This apparatus includes a reaction tube 3 provided with a gas supply pipe 5 connected to a lower portion, such that the gas supply hole 91 is disposed below a wafer boat 31. An exhaust pipe 92 is connected to the top of the reaction tube 3, so that gases flow upward in the reaction tube 3. The exhaust pipe 92 is provided with a valve 93. A heater (auxiliary heater) 22a is disposed above the reaction tube 3. According to the second embodiment, a method of forming a silicon oxide film can be performed similarly to the first embodiment.

EXAMPLES

In order to study the effects of a method according to an embodiment of the present invention, silicon oxide films were formed, as described below, and the dielectric breakdown strength of the silicon oxide films thus formed were examined.

Present Example 1

A bare wafer cleaned by hydrofluoric acid was prepared, and, in the apparatus shown in FIGS. 1 and 2, a silicon oxide film of 1.0 nm was formed on the wafer, in accordance with the sequence shown in FIG. 4. The temperature inside the reaction tube in loading the wafer was set at 300° C. The thermal oxidation process was performed by wet oxidation, as in the embodiments described above, at a process temperature of 650° C. The process time was set at 40 minutes. The average heating rate was set at 50° C./minute.

During the heating step, the ratio of moisture relative to a mixture gas of moisture and oxygen gas was set at 13.3%. In order to achieve this, the flow rates of hydrogen gas and oxygen gas were set to be 50 sccm and 350 sccm, respectively, while the heating temperature in the moisture generator 6 was set at 350° C. In addition, the flow rate of nitrogen gas was set at 12.8 slm, and the pressure inside the reaction tube was set at 133 Pa (1.0 Torr). Under these conditions, the moisture concentration in the atmosphere of the process area within the reaction tube was set at 5 ppm.

During the thermal oxidation process, the ratio of moisture relative to a mixture gas of moisture and oxygen gas was set at 13.3%. In order to achieve this, the flow rates of hydrogen gas and oxygen gas were set to be 100 sccm and 700 sccm, respectively Comparative Example 1

A silicon oxide film was formed in the same way as the present example 1, except that the reaction tube was not supplied with moisture, but supplied with oxygen gas at a flow rate of 10 sccm, during the heating step.

(Dielectric Breakdown Strength Test)

Using the silicon oxide films according to the present example 1 and comparative example 1 thus obtained, samples of a MOS capacitor structure were simply fabricated. Then, these samples were subjected to a test for measuring their dielectric breakdown strength.

Figure 7:
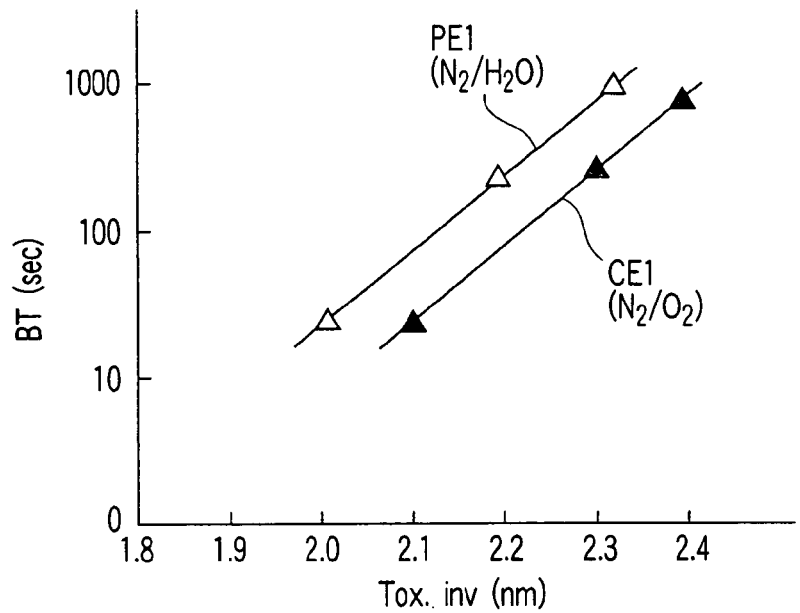
FIG. 7 is a graph showing the relationship between capacity-converted film thickness Tox.inv (nm) and time until dielectric breakdown BT (sec) in insulating films according to a present example 1 (PE1) and a comparative example 1 (CE1)
Figure 8:
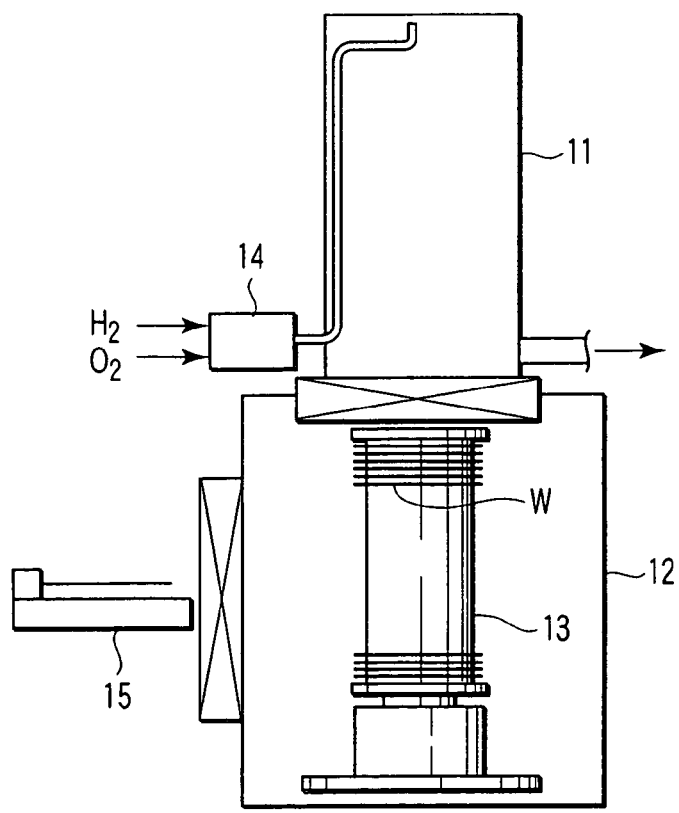
FIG. 8 is a side view showing a conventional vertical heat-processing apparatus.

FIG. 7 is a graph showing the relationship between capacity-converted film thickness and time until dielectric breakdown in the insulating films according to the present example and comparative example 1. In FIG. 7, the horizontal axis denotes the capacity-converted film thickness Tox.inv (nm), and the vertical axis denotes the time until dielectric breakdown (service lifetime) BT (sec). Also, in FIG. 7, lines PE1 and CE1 denote data of the present example 1 (Δ) and comparative example 1 (▲), respectively. As shown in FIG. 7, the silicon oxide film of the present example 1 showed a improved value of dielectric breakdown strength (the service lifetime of the oxide film) two or more times higher than that of the silicon oxide film of the comparative example 1. It has therefore been confirmed that the presence of a small amount of moisture during the heating step is effective.

Heat-processing apparatuses or methods according to the present invention are preferably applied to those of the hot-wall type, in which the entire reaction container is heated. However, the apparatuses or methods are not limited to apparatuses or methods of the batch type, in which a plurality of target substrates are held on a holder and processed in a reaction container. Alternatively, the apparatuses or methods may be applied to apparatuses or methods of the single-substrate type, in which a single target substrate is held on a holder and processed in a reaction container. In this latter case, for example, a process apparatus may have a structure arranged to load a single target substrate along with a holder into a reaction container from the bottom port thereof. Furthermore, the target substrate does not necessarily need to have been cleaned by acid cleaning.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a silicon oxide film having a film thickness of 1.6 nm or less, the method comprising:
   loading a target substrate that has a silicon layer on a surface into a process area within a reaction container, while setting the process area to have a loading temperature of 400° C. or less;
   generating water vapor in a water vapor generator disposed outside the reaction container, by causing hydrogen gas and oxygen gas to react with each other;
   increasing the temperature of the process area that accommodates the target substrate, from the loading temperature to a process temperature of 650° C. or more at an average temperature increasing rate of 50° C./minute to 100° C./minute;
   supplying the water vapor from the water vapor generator into the reaction container during said increasing the temperature of the process area, continuously from a time when the process area has a temperature of 400° C. or less to a time when the process area has the process temperature, while setting the water vapor to have a first concentration of 5 ppm to 1,000 ppm in an atmosphere of the process area, and setting the process area to have a first reduced pressure, thereby oxidizing the silicon layer to form an initial oxide film; and
   supplying an oxidation gas into the reaction container, after said increasing the temperature of the process area to the process temperature, thereby oxidizing the silicon layer to grow the initial oxide film, so as to form a silicon oxide film having a film thickness of 1.6 nm or less.

2. The method according claim 1, wherein the water vapor generator is configured to cause the oxygen gas and the hydrogen gas to react with each other in the presence of a catalyst, while setting the oxygen gas to be an amount larger than that determined by a stoicheiometric ratio in a water generating reaction, so as to supply surplus oxygen gas along with the water vapor thereby generated.

3. The method according claim 2, further comprising setting the first concentration by supplying a diluting gas into the process area by an amount larger than a total amount of the surplus oxygen gas and the water vapor.

4. The method according claim 3, further comprising adjusting the first concentration by controlling a flow rate of any one of the hydrogen gas, the oxygen gas, and the diluting gas, or the first reduced pressure.

5. The method according claim 1, wherein the first reduced pressure falls in a range of 66.5 Pa to 13.3 kPa.

6. The method according claim 1, wherein the oxidation gas comprises water vapor.

7. The method according claim 6, wherein the water vapor used as the oxidation gas is set to have a concentration in an atmosphere of the process area, higher than the first concentration.

8. The method according claim 1, wherein the process temperature is 900° C. or less.

9. The method according claim 1, wherein the water vapor generator is configured to set a volume percent of the water vapor relative to a total amount of the surplus oxygen gas and the water vapor to be 0.1 to 80%.

10. A method for forming a silicon oxide film having a film thickness of 1.6 nm or less on a plurality of target substrates, which have a silicon layer on a surface and held at intervals in a vertical direction on a holder within a process area of a vertical process container, the method comprising:
    loading the holder along with the target substrate held thereon into a process area within the reaction container, while setting the process area to have a loading temperature of 400° C. or less;
    generating water vapor in a water vapor generator disposed outside the reaction container, by causing hydrogen gas and oxygen gas to react with each other, the water vapor generator being configured to cause the oxygen gas and the hydrogen gas to react with each other in the presence of a catalyst, while setting the oxygen gas to be an amount larger than that determined by a stoicheiometric ratio in a water generating reaction, so as to supply surplus oxygen gas along with the water vapor thereby generated;

increasing the temperature of the process area that accommodates the target substrate, from the loading temperature to a process temperature of 650 to 900° C., at an average temperature increasing rate of 50° C./minute to 100° C./minute;

supplying the surplus oxygen gas and the water vapor from the water vapor generator and nitrogen gas mixed therewith by an amount larger than a total amount of the surplus oxygen gas and the water vapor into the reaction container during said increasing the temperature of the process area, continuously from a time when the process area has a temperature of 400° C. or less to a time when the process area has the process temperature, while setting the water vapor to have a first concentration of 5 ppm to 1,000 ppm in an atmosphere of the process area, and setting the process area to have a first reduced pressure of 66.5 Pa to 13.3 kPa, thereby oxidizing the silicon layer to form an initial oxide film; and supplying an oxidation gas into the reaction container, after said increasing the temperature of the process area to the process temperature, thereby oxidizing the silicon layer to grow the initial oxide film, so as to form a silicon oxide film having a film thickness of 1.6 nm or less.

11. The method according claim 10, further comprising adjusting the first concentration by controlling a flow rate of any one of the hydrogen gas, the oxygen gas, and the nitrogen gas, or the first reduced pressure.

12. The method according claim 10, wherein the oxidation gas comprises water vapor.

13. The method according claim 12, wherein the water vapor used as the oxidation gas is set to have a concentration in an atmosphere of the process area, higher than the first concentration.

14. The method according claim 10, wherein the water vapor generator is configured to set a volume percent of the water vapor relative to a total amount of the surplus oxygen gas and the water vapor to be 0.1 to 80%.

* * * * *